(12) United States Patent
Suzuki et al.

(10) Patent No.: US 8,754,689 B2
(45) Date of Patent: Jun. 17, 2014

(54) SWITCHING ELEMENT DRIVING DEVICE AND METHOD

(75) Inventors: Youichirou Suzuki, Okazaki (JP); Yasuhiro Fukagawa, Obu (JP); Takeshi Nakamura, Nagoya (JP)

(73) Assignees: DENSO CORPORATION, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 13/535,482

(22) Filed: Jun. 28, 2012

(65) Prior Publication Data

US 2013/0009671 A1 Jan. 10, 2013

(30) Foreign Application Priority Data

Jul. 5, 2011 (JP) .................................. 2011-149126

(51) Int. Cl.
*H03K 5/12* (2006.01)
(52) U.S. Cl.
USPC .......................................................... 327/170
(58) Field of Classification Search
USPC ........................................... 326/29; 327/170
See application file for complete search history.

(56) References Cited

U.S. PATENT DOCUMENTS

2006/0244479 A1* 11/2006 Major .............................. 326/29
2010/0110738 A1 5/2010 Shimizu

FOREIGN PATENT DOCUMENTS

| JP | 05-191241 A | 7/1993 |
| JP | 09-93116 A | 4/1997 |
| JP | 10-336011 A | 12/1998 |
| JP | A-2001-016088 | 1/2001 |
| JP | A-2008-005682 | 1/2008 |

OTHER PUBLICATIONS

Office Action mailed May 28, 2013 in corresponding JP patent application No. 2011-149126 (and English translation).

* cited by examiner

*Primary Examiner* — Daniel Rojas
(74) *Attorney, Agent, or Firm* — Posz Law Group, PLC

(57) ABSTRACT

A slew rate regulation circuit varies a slew rate of a waveform of a voltage outputted to a DC motor through a N-channel MOSFET. The slew rate regulation circuit lowers a peak level by dispersing frequency components of switching noise, which develops in a frequency range higher than a frequency range determined by a carrier frequency.

11 Claims, 8 Drawing Sheets

GATE DRIVING WAVEFORM

HARMONICS SPECTRUM

US 8,754,689 B2

SWITCHING ELEMENT DRIVING DEVICE AND METHOD

CROSS REFERENCE TO RELATED APPLICATION

This application is based on and incorporates herein by reference Japanese patent application No. 2011-149126 filed on Jul. 5, 2011.

TECHNICAL FIELD

The present disclosure relates to a switching element driving device and method for generating a driving signal and outputting the same to a control terminal of a switching element, which is to be driven to turn on.

BACKGROUND TECHNOLOGY

An electric load such as a DC motor is driven by pulse width modulation (PWM) by a switching element such as a power MOSFET, which is connected in series to the load. In this case, noise is generated by the switching operation of the switching element. The PWM control is performed at a carrier frequency, which is generally set in a several kHz range. In case of driving a motor mounted in a vehicle, for example, it is required, to take a measure so that radio communication devices such as a car radio receiver are not adversely influenced by the noise. Patent document (JP 2008-5682A) proposes, for countering this problem, to vary the carrier frequency in a predetermined range so that a peak of the noise will not concentrate on one frequency.

The technology disclosed in JP 2008-5682A reduces a noise, which affects a radio receiver of an AM frequency band. However, it does not reduce noise, which affects a radio receiver of a FM frequency band. The noise generated in a MHz frequency band is dependent on a change rate or gradient, that is, a slew rate of a waveform of a driving voltage, which turns on and off the switching element. It is possible to reduce the frequency of generated noise by decreasing the gradient of the waveform. This however prolongs a turn-on and turn-off period of the switching element and increases switching loss.

SUMMARY

It is therefore an object to provide a switching element driving device and method, which suppresses switching noise generated at higher frequencies while suppressing an increase in switching loss.

According to one aspect, a switching element driving device and method comprises an output switching element, a driving signal generation section and a slew rate regulation section. The output switching element is controlled to turn on and off for driving a load. The driving signal generation section generates a driving signal and outputs the driving signal to a control terminal of the output switching element. The slew rate regulation section variably regulates a slew rate of a voltage waveform of a voltage outputted to the load by the output switching element.

BRIEF DESCRIPTION OF THE DRAWINGS

The above and other objects, features and advantages will become more apparent from the following detailed description made with reference to the accompanying drawings. In the drawings:

FIG. 9 is a flowchart showing control processing of a signal processing circuit and the like;

DETAILED DESCRIPTION OF EMBODIMENTS (First Embodiment)

Figure 1:
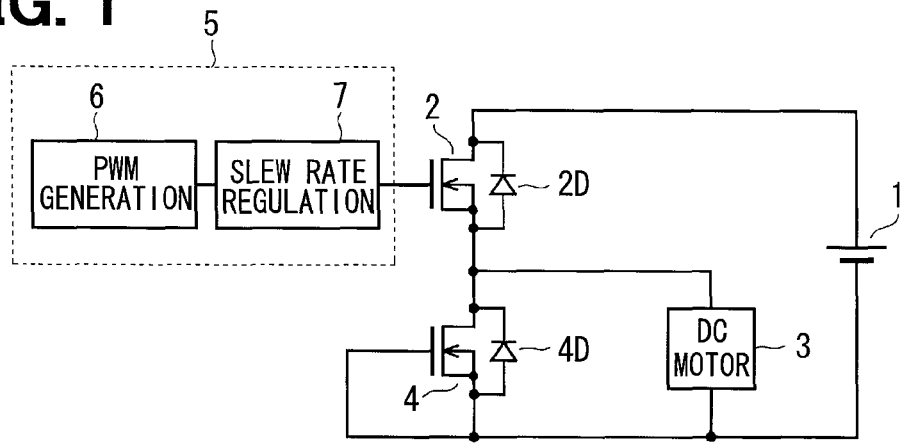
FIG. 1 is a block diagram schematically showing a switching element driving device according to a first embodiment.

Referring first to FIG. 1 showing a first embodiment of a switching element driving device (driving device), a series circuit of a N-channel MOSFET 2 (output switching element to be controlled) and a DC motor 3 (electric load) is connected between a positive terminal (+B) and a negative terminal (ground) of a power source (battery) 1. A N-channel MOSFET 4 is connected in series with the FET 2 and in parallel to the DC motor 3. The FET 4 is always turned off with its gate being directly connected to the ground. That is, the FET 4 is connected to use its parasitic diode 4D as a flywheel diode.

A gate driving circuit 5 is provided as a driving device to apply a gate signal to a gate (control terminal) of the FET 2. The gate driving circuit 5 includes a pulse width modulation (PWM) signal generation circuit 6 (driving signal generation section) and a slew rate regulation circuit 7 (slew rate regulation section). The slew rate regulation circuit 7 varies a slew rate of the PWM signal generated and outputted by the PWM signal generation circuit 6 and applies a gate signal (driving signal) to the gate of the FET 2.

Figure 3A:
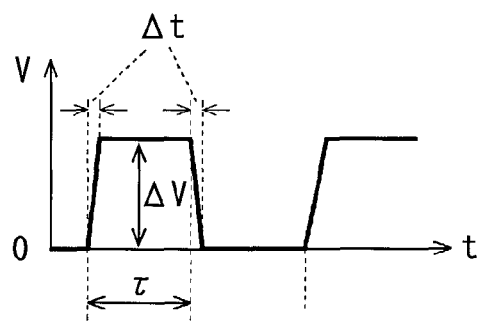
FIG. 3A is a signal waveform chart showing a slew rate of a PWM signal.
Figure 3B:
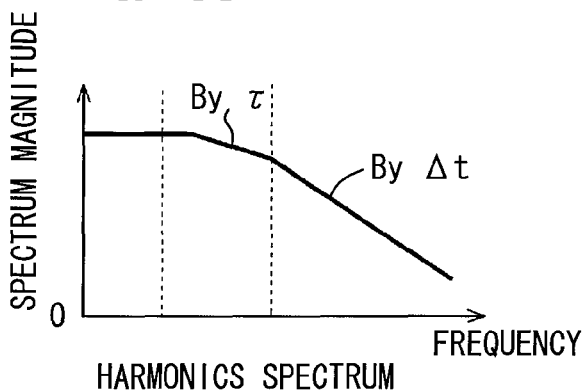
FIG. 3B is a graph showing a relation between a frequency and a spectrum magnitude of noise generated when a MOSFET is switched over.

A slew rate of the PWM signal waveform is shown in FIG. 3A. A frequency spectrum of switching noise generated when the FET is switched by the PWM signal is shown in FIG. 3B. The slew rate is defined as a change rate of a voltage in a unit time, that is, a voltage difference divided by time difference ($\Delta V/\Delta t$). In case of PWM control, the amplitude of the PWM signal is fixed and hence the slew rate corresponds to the time difference $\Delta t$. Thus slew rate $\Delta t$ is used to mean a rise time of the PWM signal from a low level to a high level or a fall time of the PWM signal from the high level to the low level. Assuming that the high level pulse width of the PWM signal is $\tau$, the magnitudes of spectrums are determined by the pulse width $\tau$ and the slew rate $\Delta t$ in an intermediate range and a higher range in frequency (abscissa), respectively. In case that the intermediate range corresponds to an AM frequency band of a radio receiver, the higher range corresponds to a FM frequency band of the radio receiver.

Figure 2:
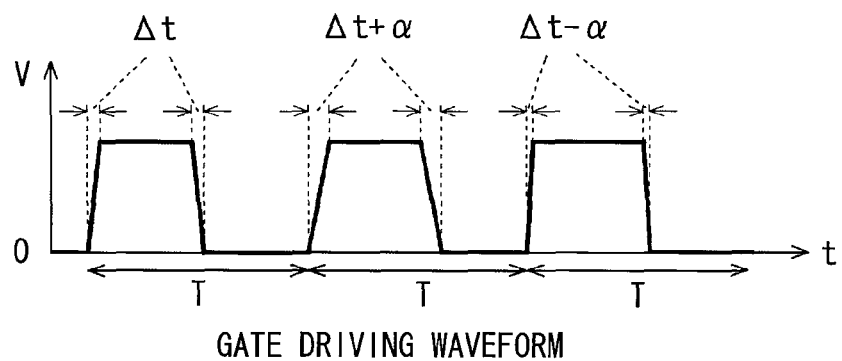
FIG. 2 is a signal waveform chart showing changes of a slew rate of a PWM signal according to the first embodiment.

The slew rate regulation circuit 7 periodically varies the slew rate (level change time) Δt, which is a reference rate, to Δt+α in the next period and to Δt−α in the subsequent period (second next period), for example, as shown in FIG. 2. The level change in a unit time is small and large in the next period and the subsequent period, respectively. By repeating the above-described changes cyclically, the average value of the slew rate (time) becomes equal to Δt.

Figure 4:
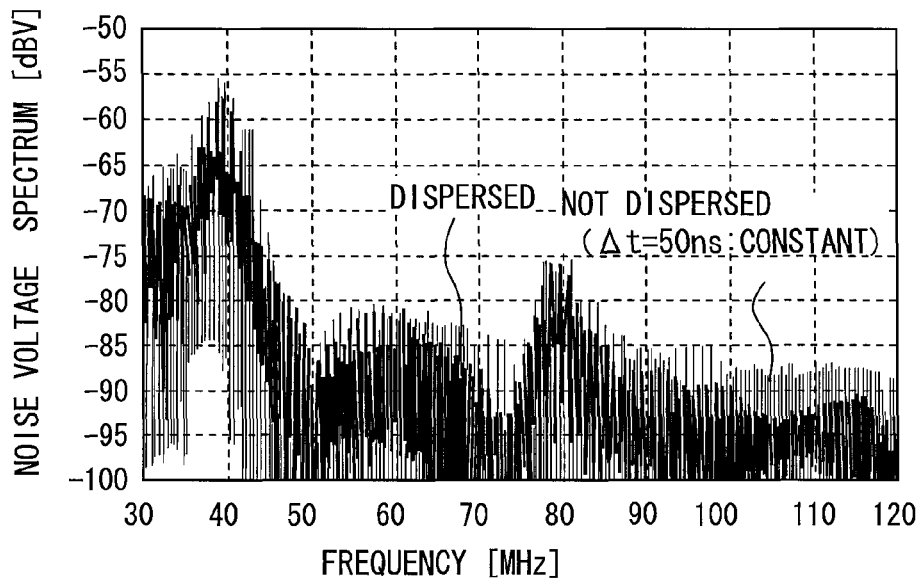
FIG. 4 is a graph showing one example of a simulation result.
Figure 5A:
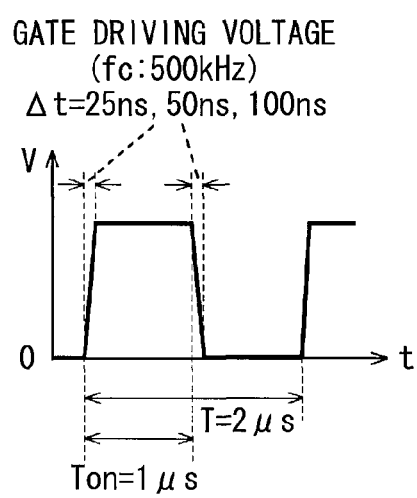
FIG. 5A and FIG. 5B are charts showing conditions of simulation shown in FIG. 4.
Figure 5B:
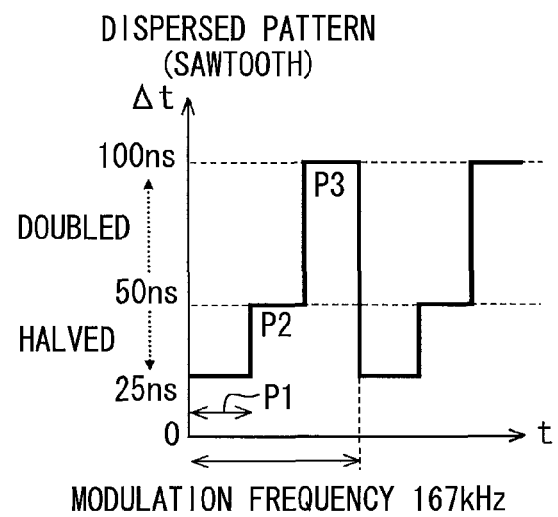

One example of simulation result is shown in FIG. 4. The simulation was conducted under different simulation conditions shown in FIG. 5A and FIG. 5B. In the simulation, the carrier frequency fc and the duty ratio of the PWM signal were set to 500 kHz and 50%, respectively. The slew rate Δt was set to 50 ns as the reference and varied to one-half (25 ns) and to two times (100 ns). A modulation frequency fm is about 167 kHz, which is one-third of the carrier frequency fc. Thus, slew rate of the PWM signal outputted to the gate of the FET 2 was thus varied so that the FET 2 responsively switches its state to energize coils (not shown) of the DC motor 3. Since the output voltage waveform changes similarly to the PWM signal, the slew rate of the output voltage waveform also varies similarly.

In FIG. 4, "not dispersed" (waveform peak indicated by light density) shows a result when the slew rate Δt was maintained at the constant value, 50 ns, and "dispersed" (waveform peak indicated by heavy density) shows a result when the slew rate Δt was varied periodically among 25 ns, 50 ns and 100 ns. In each case, remarkable peaks appear around frequencies 40 MHz and 40 MHz. However, a noise voltage spectrum (dBV) is generally lower in case of "dispersed" than in case of "not dispersed." In this simulation, the average value of switching loss does not correspond to that of the reference value Δt=50 ns. If it should correspond to that of the reference value, the slew rate may be changed to 75 ns (that is, α=25 ns) in place of changing to 100 ns.

According to the first embodiment, the slew rate regulation circuit 7 varies the slew rate of the voltage waveform outputted to the DC motor 3 through the FET 2. It is therefore possible to lower the peak level by dispersing frequency components of the switching noise, which is generated in the frequency range higher than the frequency range determined by the carrier frequency. As a result, even when the DC motor 3 is mounted in the vehicle, the car radio receiver is protected from being influenced adversely by the noise in receiving FM broadcasting.

Further, the slew rate regulation circuit 7 varies by switching the time of change of the voltage waveform relative to the reference value Δt from Δt−α to Δt+α so that its average value becomes the average value Δt. As a result, the switching loss is restricted from increasing by regulating the average value to be equal to the reference value Δt even in case of changing the slew rate.

(Second Embodiment)

Figure 6:
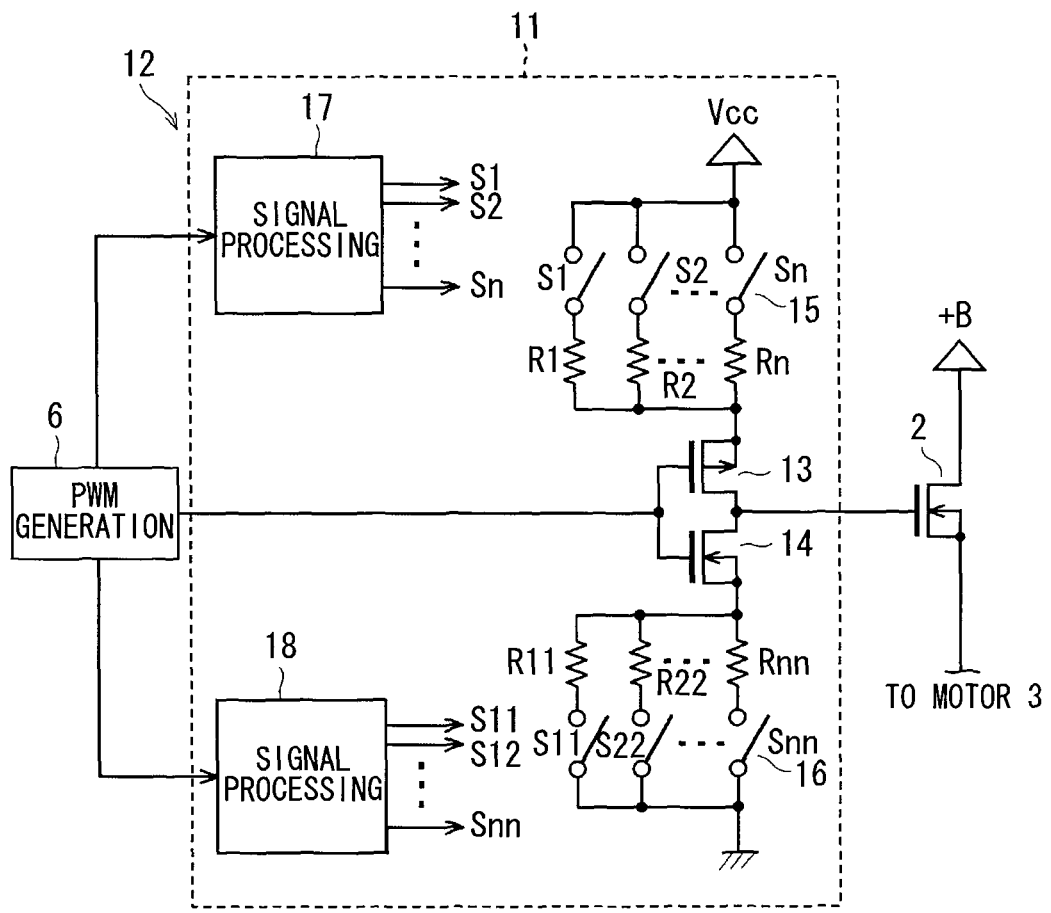
FIG. 6 is a circuit diagram showing a driving device according to a second embodiment.

A second embodiment is shown in FIG. 6, in which the same parts as the first embodiment are designated by the same reference numerals for simplification of description.

The second embodiment has a gate driving circuit 12 (driving device) including a slew rate regulation circuit 11 (slew rate regulation section). The slew rate regulation circuit 11 has an output stage formed of a P-channel MOSFET 13 (power side switching element) and a N-channel MOSFET 14 (ground side switching element), which are connected in series and in push-pull configuration. Drains (non-reference side conductive terminals) of both FETs 13 and 14, which are common junctions, are connected to the gate of the FET 2. PWM signals outputted by the PWM signal generation circuit 6 are applied to gates of both FETs 13 and 14.

A power side resistor circuit 15 is formed of series circuits, which are formed of a pair of a switch S1 and a resistor R1, a pair of a switch S2 and a resistor R2, a pair of a switch SWn and a resistor Rn, and the like. These series circuits are connected in parallel between a power source Vcc and a source of the FET 13 (reference potential side conductive terminal). A ground side resistor circuit 16 is formed of series circuits, which are formed of a pair of a resistor R11 and a switch S11, a pair of a resistor R22 and a switch S22, a pair of a resistor Rnn and a switch Snn, and the like. These series circuits are connected in parallel between a source of the FET 14 and the ground.

The slew rate regulation circuit 11 includes a power side signal processing circuit 17 and a ground side signal processing circuit 18. The PWM signals outputted from the PWM signal generation circuit 6 or the PWM carriers are inputted to the signal processing circuits 17 and 18. The signal processing circuits 17 and 18 cyclically count the output number of the PWM signals outputted from the PWM signal generation circuit 6, for example, and control on-off of the switches S1 to Sn of the power side resistor circuit 15 and the switches S11 to Snn of the ground side resistor circuit 16 in accordance with the count value as states, respectively.

It is assumed here that resistance values of the resistors R1 to Rn are different one another, and the resistances of the resistors R11 to Rnn are equal to the resistances of the resistors R1 to Rn, respectively. It is further assumed that the count values of the signal processing circuits 17 and 18 are reset in an initial state and all of the switches S1 to Sn and the switches S11 to Snn are in the off-state. When the PWM signal generation circuit 6 starts outputting the PWM signals, the signal processing circuits 17 and 18 count the PWM signals. The signal processing circuits 17 and 18 turn on only the switches S1 and S11 in response to counting the first pulses, respectively, and turn on only the switches S2 and S12 in response to counting the second pulses, respectively. The signal processing circuits 17 and 18 thus sequentially turn on the switches.

When the PWM signal is low, the FET 13 forming the output stage turns on to change the gate potential of the FET 2 to the high level so that the FET 2 turns on. When the PWM signal is high, the FET 14 turns on to change the gate potential of the FET 2 to the low level so that the FET 2 turns off. In this case, the output voltage waveform becomes an inverse of the PWM signal waveform.

The signal processing circuit 17 sequentially turns on and off the switches S1 to Sn of the resistor circuit 16 at every PWM period. The signal processing circuit 18 also sequentially turns on and off the switches S11 to Snn at every PWM period. Thus the resistance values between the gate and the power source Vcc and the ground of the FET 2 are sequentially changed. As a result, since a charge-discharge time constant including a gate capacitance of the FET 2, the gradient of a charge-discharge voltage waveform, that is, the slew rate of the waveform of the PWM signal outputted to the gate of the FET 2, changes. The slew rate of the voltage waveform applied to the DC motor 3 through the FET 2 periodically changes.

According to the second embodiment, as described above, the slew rate regulation circuit 11 regulates the slew rate of the voltage waveform outputted to through the FET 2 by changing the slew rate of the PWM signal waveform. More specifically, the power side resistor circuit 15 and the ground side resistor circuit 16 are provided between the power source Vcc and the FET 13 and between the FET 14 and the ground, respectively. The switches S1 to Sn and the switches S11 to Snn are on-off controlled in synchronization with the input timing of the PWM signal.

It is therefore possible to vary the slew rate of the PWM signal waveform by varying sequentially the resistance values between the gate of the FET 2 and the power source Vcc and between the gate of the FET 2 and the ground. It is not required that the signal processing circuits 17 and 18 always on-off control the switches S1 to Sn and S11 to Snn in accordance with a predetermined pattern in synchronization with the input of the PWM signal. For example, the switches S1 to Sn and S11 to Snn may be switched to on and off at random by generating random numbers.

(Third Embodiment)

Figure 7:
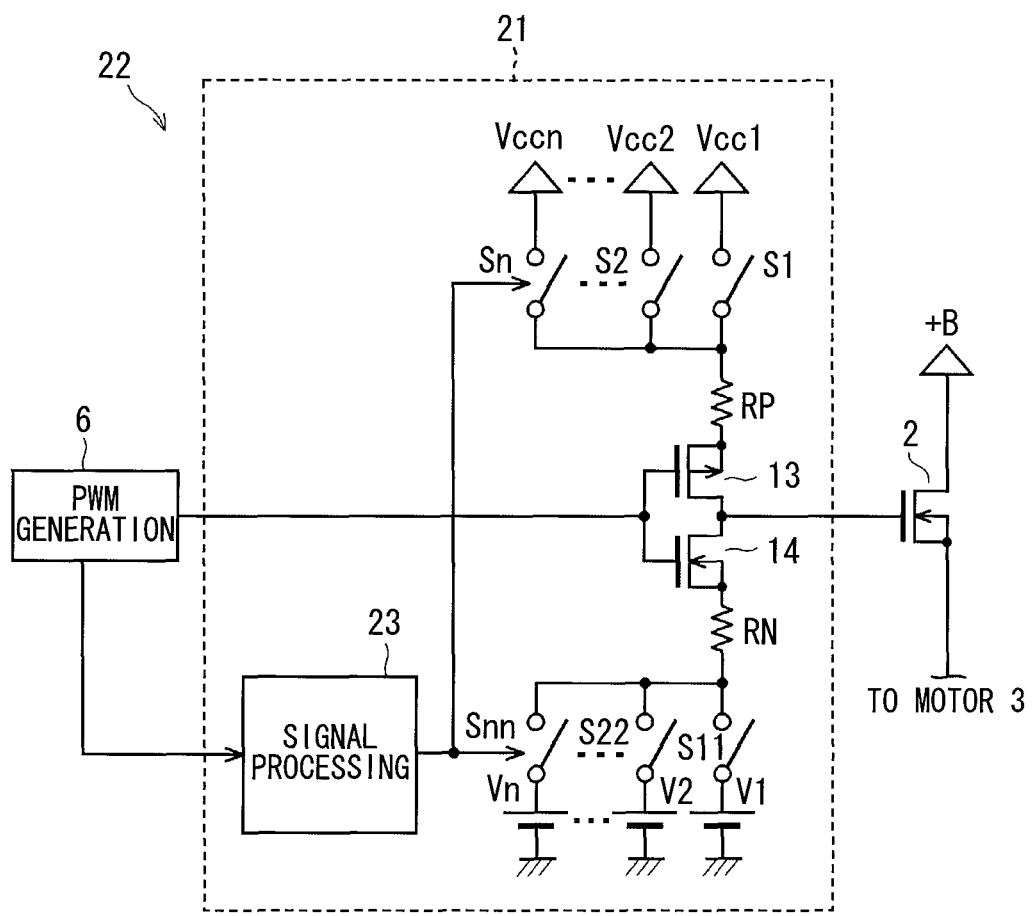
FIG. 7 is a circuit diagram, which corresponds to FIG. 6, showing a third embodiment.

A third embodiment is shown in FIG. 7 and different from the second embodiment as follows.

In the third embodiment, a gate driving circuit 22 (driving device) is formed by a slew rate regulation circuit 21 (slew rate regulation section) in place of the slew rate regulation circuit 11. One ends of the switches S1 to Sn are connected to the source (power side conductive terminal) of the FET 13 through one resistor RP. Power sources Vcc1, Vcc2 to Vccn of different voltages are connected to the other ends of switches S1 to Sn.

One ends of the switches S11 to Snn are connected to the source (ground side conductive terminal) of the FET 13 through one resistor RN. The power sources V1, V2 to Vn of different voltages (potential application section) are connected between the other ends of the switches S11 to Snn and the ground. The on-off of the switches S1 to Sn and the on-off of the switches S11 to Snn are controlled by a signal processing circuit 23.

That is, according to the third embodiment, the power voltage in the slew rate regulation circuit 21 and the ground side potential are varied in place of varying resistance values of the power side and the ground side as performed in the second embodiment. The signal processing circuit 23 switches over a source potential of the FET 13 and a source potential of the FET 14 by sequentially switching over the on-off states of the switches S1 to Sn and the switches S11 to Snn in synchronization with the input of the input timing of the PWM signal.

According to the third embodiment described above, the slew rate regulation circuit 21 switches over the plurality of switches S1 to Sn and S11 to Snn in synchronization with the input timing of the slew rate regulation circuit 21 so that the source potentials of the FET 13 and the FET 14 are switched over. Thus, the slew rate of the PWM signal waveform can be varied by the potential change in the similar manner as in the second embodiment.

(Fourth Embodiment)

Figure 8:
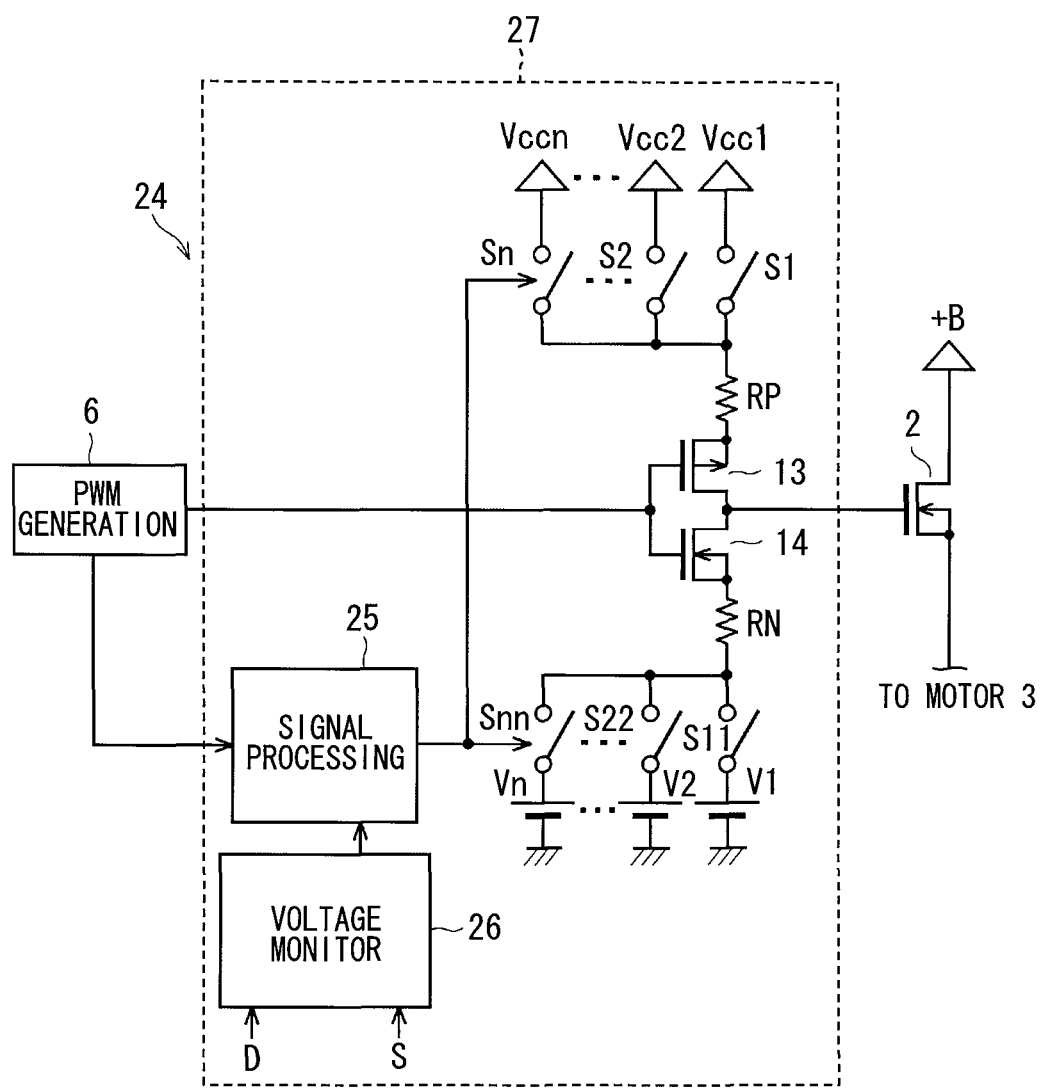
FIG. 8 is a circuit diagram, which corresponds to FIG. 6, showing a fourth embodiment.
Figure 9:
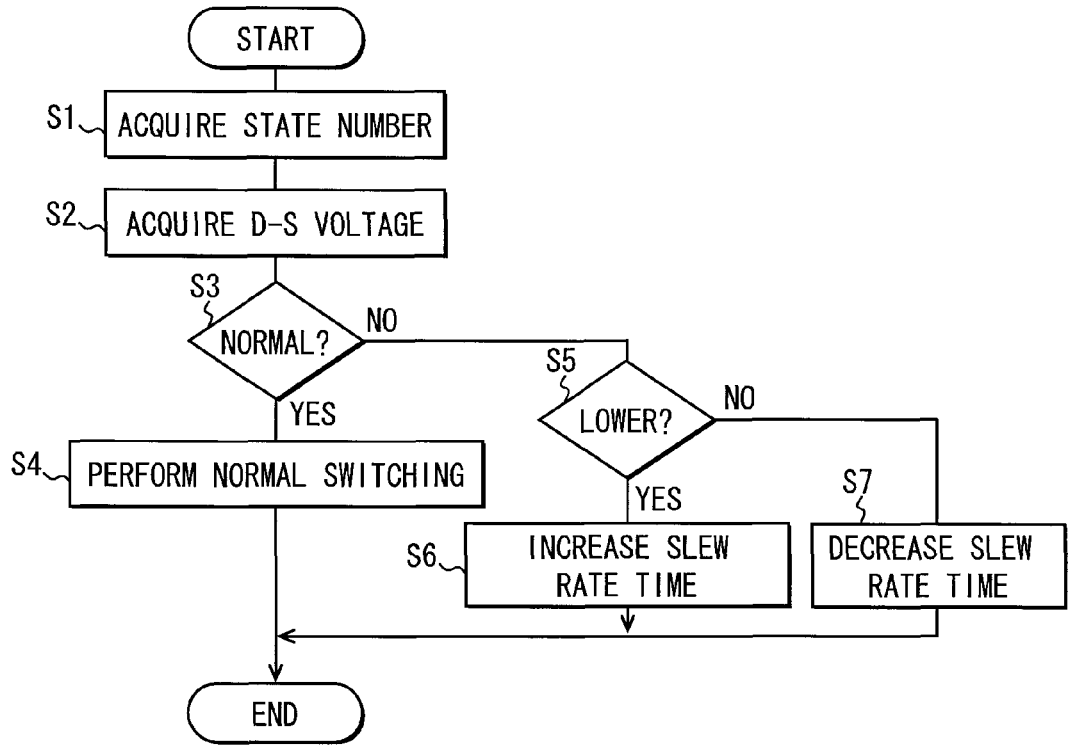

A fourth embodiment is shown in FIG. 8 and FIG. 9 and different from the third embodiment as follows.

A gate driving circuit 24 (driving device) in the fourth embodiment has a slew rate regulation circuit 27 (slew rate regulation section). In the slew rate regulation circuit 27, a signal processing circuit 25 is provided in place of the signal processing circuit 23 in the slew rate regulation circuit 21 of the third embodiment. Further, a voltage monitor circuit 26 (voltage detection section) is provided. The voltage monitor circuit 26 detects a drain-source (D-S) voltage (conductive terminal voltage, load driving voltage) of the FET 2 and outputs a detection result to the signal processing circuit 25. The signal processing circuit 25 operates to correct the control, which is performed in the third embodiment, in accordance with the D-S voltage level.

The slew rate regulation circuit 27, particularly the signal processing circuit 25, is configured to perform control processing shown in FIG. 9. The signal processing circuit 25 may be configured by a hardware-logic circuits or a microcomputer. The signal processing circuit 25 first acquires the state number, that is, the output number of the PWM signal pulses counted by its internal counter (step S1). The signal processing circuit 25 then acquires the D-S voltage (step S2), which is detected by the voltage monitor circuit 26. The signal processing circuit 25 checks whether the D-S voltage is within a normal range (step S3).

If the detected voltage is within the normal range (YES), the signal processing circuit 25 controls switching of the switches S1 to Sn in accordance with the state number (step S4), which is acquired at step S1, in the similar manner as in the third embodiment. If the voltage is not within the normal range (NO), the signal processing circuit 25 checks whether the voltage is lower than the normal range (step S5). If it is lower (YES), the slew rate time (change time) is regulated to be longer than a time determined at step S4, that is, increased (step S6).

In this processing, when the D-S voltage of the FET 2 falls because of falling of the voltage +B of the power source 1, for example, the loss caused in the switching operation of the FET 2 also decreases. In this case, even if the slew rate is decreased by lowering a driving signal voltage in the slew rate regulation circuit 27, that is, the PWM signal amplitude, not only the switching loss does not increase but also generation of the switching noise is suppressed.

If the D-S voltage is higher than the normal range at step S5 (NO), the slew rate time (change time) is regulated to be shorter than the time determined at step S4, that is, decreased (step S7). For this reason, the voltage monitor circuit 26 may be formed of a window comparator, which checks whether the detected voltage is within a predetermined range. It may alternatively be an A/D conversion circuit, which converts the detected voltage and outputs a digital value corresponding to the detected voltage.

According to the fourth embodiment, the circuit 27 is configured to switch over on and off of the switches S1 to Sn and the switches S11 and Snn in synchronization with the input timing of the PWM signal and in accordance with the detected level of the D-S voltage of the FET 2. Thus it is possible to regulate the slew rate in accordance with the voltage change in the power source 1 so that generation of the switching noise is suppressed without increasing the switching loss.

(Fifth Embodiment)

Figure 10:
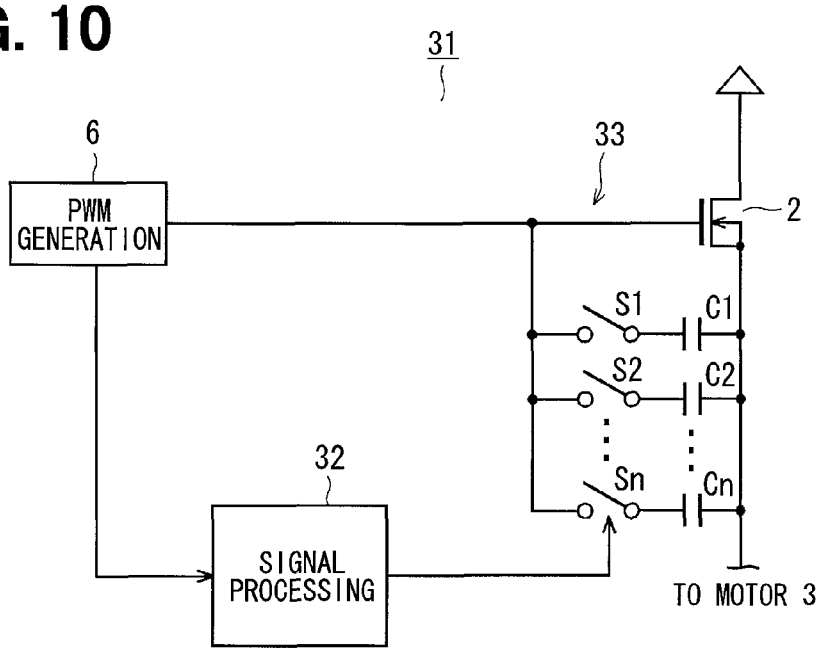
FIG. 10 is a circuit diagram, which corresponds to FIG. 6, showing a fifth embodiment.

A fifth embodiment is shown in FIG. 10.

In the fifth embodiment, a gate driving circuit 31 (driving device) is configured to output the PWM signal, which is outputted from the PWM signal generation circuit 6, to the gate of the FET 2 directly. A slew rate regulation circuit 33 (slew rate regulation section) is formed of a signal processing circuit 32 and a parallel circuit of a plurality of switch-capacitor series circuits. The parallel circuit is connected in parallel between the gate and the source of the FET 2. The series circuits are formed of the switch S1 and a capacitor C1, the switch S2 and a capacitor C2, the switch Sn and a capacitor Cn, and the like. The signal processing circuit 32 is configured to switch over on and off of the switches S1 to Sn in synchronization with the inputted PWM signal.

The gate-source capacitance of the FET 2 increases as the number of switches, which are turned on at the same time, among the switches S1 to Sn increases. In this case, the slew rate (change time) is increased. If the number of the switching elements turning on at the same time decreases, the gate-source capacitance decreases and the slew rate (change time)

is decreased. Thus, the fifth embodiment performs the similar control operation as the first embodiment and the like.

According to the fifth embodiment, as described above, plural series circuits of the switches S1 to Sn and the capacitors C1 to Cn are provided between the gate and the source of the FET 2 and the on-off of the switches S1 to Sn are switched over in synchronization with the input timing of the PWM signal. Thus, the slew rate of the output voltage waveform can be varied by varying the gate-source capacitance of the FET 2.

(Sixth Embodiment)

Figure 11:
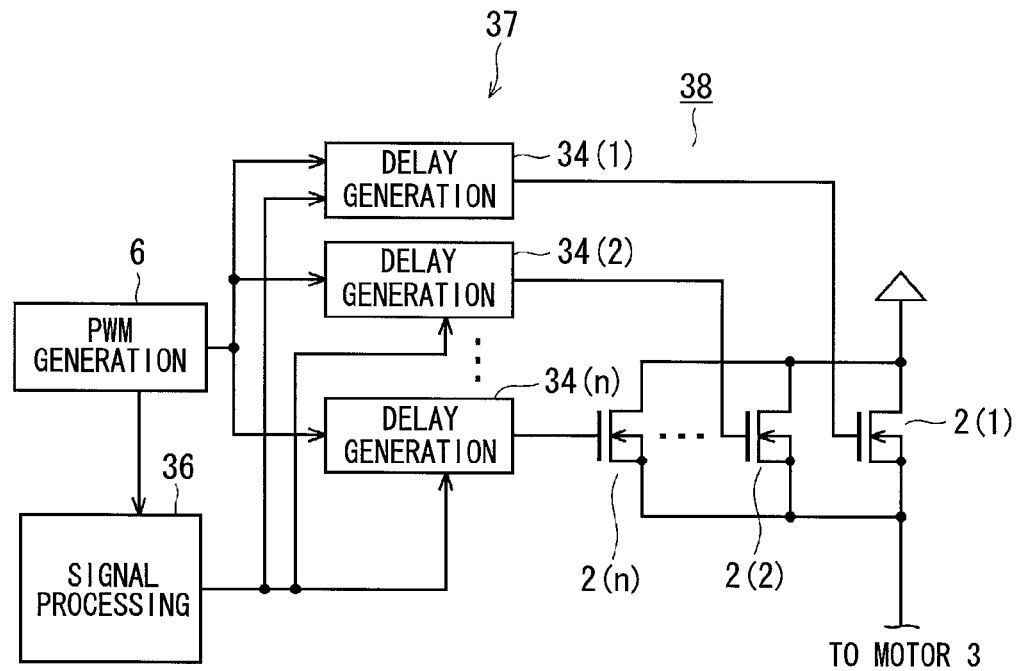
FIG. 11 is a circuit diagram, which corresponds to FIG. 6, showing a sixth embodiment.
Figure 12:
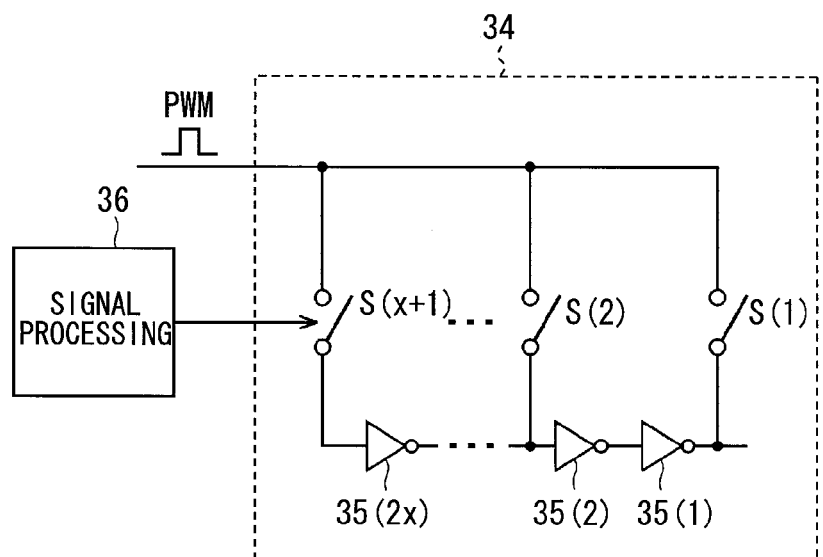
FIG. 12 is a circuit diagram showing a delay time generation circuit in the sixth embodiment.

A sixth embodiment is shown in FIG. 11 and FIG. 12.

In the sixth embodiment, n-units of N-channel MOSFETs 2(1) to 2(n) are connected in parallel as switching elements to be driven. The PWM signal outputted from the PWM signal generation circuit 6 is applied to gates of the FETs 2(1) to 2(n) through delay time generation circuits (delay circuits) 34(1) to 34(n).

Each of the delay time generation circuits 34(1) to 34(n) is shown as a delay time generation circuit 34 in FIG. 12. The delay time generation circuit 34 includes an even number $2x$ of inverter gates 35(1) to 35(2x) connected in series. The delay time generation circuit 34 further includes switches S(1) to S(x+1), which are connected to inputs of every two inverter gates 35 and to an output of the last-stage inverter gate 35(1). The PWM signal of the PWM signal generation circuit 6 is applied to the other end side of the switches S1 to S(x+1). A signal processing circuit 36 outputs a control signal, which switches over on and off of the switches S1 to S(x+1) in the delay time generation circuit 34(1) to 34(n). The delay time generation circuits 34(1) to 34(6) and the signal processing circuit 36 form a gate driving circuit 37 (driving device). The FETs 2(1) to 2(n) and the gate driving circuit 37 form a slew rate regulation section 38.

The delay time generation circuits 34 selectively turn on any one of the switches S(1) to S(x+1) so that two times of a propagation delay time of one inverter gate 35 is applied to the inputted PWM signal. The signal processing circuit 36 thus controls the on and off of the switches S(1) to S(x+1) so that the n-units of FETs 2(1) to 2(n) turn on and off at different timings relative to the PWM signal, which is common. As a result, the slew rate of the voltage waveform applied to the DC motor 3 through the FETs 2(1) to 2(n) is regulated.

According to the sixth embodiment, as described above, the slew rate regulation circuit 38 includes a plurality of delay time generation circuits 34(1) to 34(n), which applies the PWM signal to the plurality of parallel-connected FETs 2(1) to 2(n) while delaying the PWM signal. Each delay time generation circuit 34 is configured by the series circuit, in which the even number of inverter gates 35(1) to 35(2x) are connected in series, and the switches S(1) to S(x+1), which are connected to the inputs or the outputs of the inverter gates 35(1) to 35(2x). The switches S(1) to S(x+1) are turned on and off in synchronization of the input timing of the PWM signal.

As the number of parallel-connected FETs 2(1) to 2(n), which turn on at the same time, increases, the number of on-resistances of the FETs 2(1) to 2(n) connected between the power source 1 and the DC motor 3 increases. As a result, the total resistance value decreases and the current supply amount increases. Since the timings of turning on or off the FETs 2(1) to 2(n) are varied by the delay times provided by the delay time generation circuits 34(1) to 34(n), the gradient of the waveform of the output voltage in the rise time and the fall time varies thereby varying the slew rate.

(Seventh Embodiment)

Figure 13:
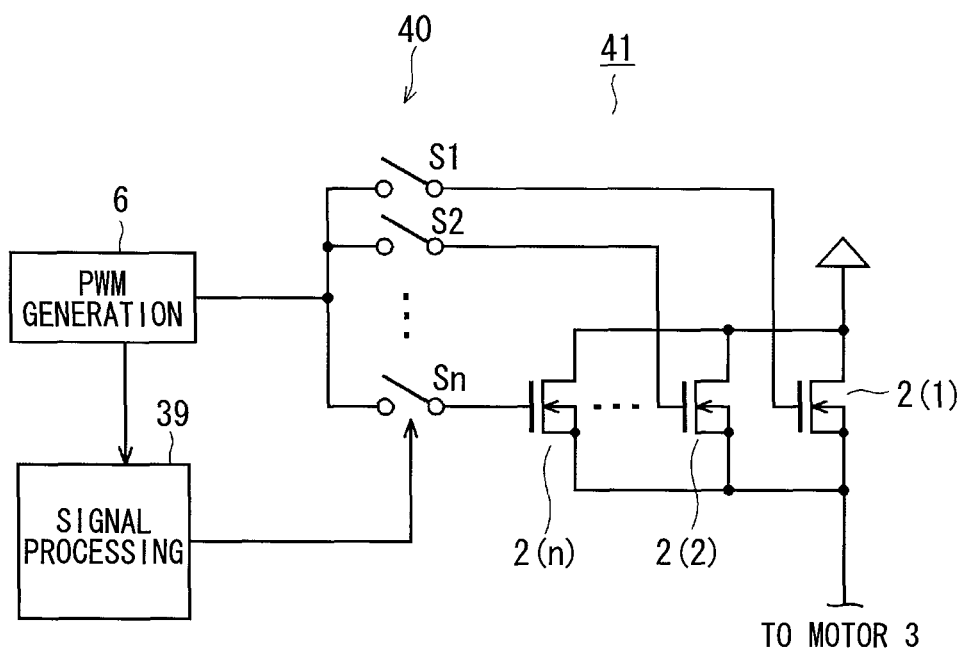
FIG. 13 is a circuit diagram, which corresponds to FIG. 6, showing a seventh embodiment.

A seventh embodiment is shown in FIG. 13 and different from the sixth embodiment as follows.

In the seventh embodiment, similarly to the sixth embodiment, a plurality of FETs 2(1) to 2(n) are connected in parallel. The PWM signal outputted from the PWM signal generation circuit 6 is applied to the gates of the FETs 2(1) to 2(n) through switches S1 to Sn, respectively. A signal processing circuit 39 outputs a control signal for switching over on and off of the switches S1 to Sn. The signal processing circuit 39 and the switches S1 to Sn form a gate driving circuit 40 (driving device). The FETs 2(1) to 2(n) and the gate driving circuit 39 form a slew rate regulation section 41.

As the number of switches S1 to Sn, which are turned on at the same time, increases, a total resistance value of the FETs 2(1) to 2(n) decreases and a load current supplied to the DC motor 3 increases. By varying the current supply amount, the gradient of the output voltage waveform in the rise time and the fall time is varied and the slew rate is varied.

The switching element driving device is not limited to only the embodiments described as above and shown in the drawings and the following variation may be implemented. The carrier frequency and the slew rate may be determined in correspondence to each design. It is not always necessary to regulate the slew rate to vary from $\Delta t-\alpha$ to $\Delta t+\alpha$ relative to the reference value $\Delta t$ so that its average value becomes the reference value $\Delta t$. As far as extraordinary large peak levels of noise are reduced, the slew rate may be regulated in other patterns or at random without a predetermined pattern.

The switching element to be driven may be a P-channel MOSFET or an IGBT. The voltage detection section may detect the voltage (+B) of the power source 1 as the load driving voltage. The switching element driving device may be applied to a high-side driving system. The load is not limited to the DC motor. The embodiments are not limited to power supply control for the load mounted in the vehicle.

What is claimed is:

1. A switching element driving device comprising:
   an output switching element, which is controlled to turn on and off, for driving a load;
   a driving signal generation section for generating a driving signal and outputting the driving signal to a control terminal of the output switching element; and
   a slew rate regulation section for variably regulating a slew rate of a voltage waveform of a voltage outputted to the load by the output switching element,
   wherein a slew rate regulation section varies periodically a time period of voltage waveform variation between $\Delta t-\alpha$ and $\Delta t+\alpha$ relative to a reference value $\Delta t$ at each generation of the driving signal so that an average value of the time period of voltage waveform variation equals the reference value $\Delta t$.

2. The switching element driving device according to claim 1, wherein:
   the slew rate regulation section varies a slew rate of a waveform of the driving signal outputted to the output switching element.

3. The switching element driving device according to claim 2, wherein the slew rate regulation section includes:
   a push-pull type output stage including a power side switching element and a ground side switching element, which are connected in series between a power source and ground and turn on exclusively in response to a level change of the driving signal; and
   a plurality of series circuits, each of which is formed of a switch and a resistor and connected between the power source and the power side switching element and between the ground side switching element and the ground, each switch connected to the power side switching element and each switch connected to the ground side switching element being turned on and off in synchronization with an input timing of the driving signal.

4. The switching element driving device according to claim 2, wherein the slew rate regulation section includes:
   a push-pull type output stage including a power side switching element and a ground side switching element, which are connected in series between a power source and ground and exclusively turn on in response to a level change of the driving signal;
   a plurality of switches connected between a power side conductive terminal of the power side switching element and a plurality of power sources having different voltages; and
   a plurality of switches connected between a ground side conductive terminal of the ground side switching element and a plurality of potential application sections provided on the ground side and having different voltages,
   each switch connected to the power side switching element and
   each switch connected to the ground side switching element being turned on and off in synchronization with an input timing of the driving signal.

5. The switching element driving device according to claim 2, wherein the slew rate regulation section includes:
   a push-pull type output stage including a power side switching element and a ground side switching element, which are connected in series between a power source and ground and exclusively turn on in response to a level change of the driving signal;
   a plurality of switches connected between a power side conductive terminal of the power side switching element and a plurality of power sources having different voltages;
   a plurality of switches connected between a ground side conductive terminal of the ground side switching element and a plurality of potential application sections provided on the ground side and having different voltages; and
   a voltage detection section for detecting a voltage supplied to the output switching element or a power source voltage,
   each switch connected to the power side switching element and
   each switch connected to the ground side switching element being turned on and off in synchronization with an input timing of the driving signal and in accordance with the voltage detected by the voltage detection section.

6. The switching element driving device according to claim 2, wherein the slew rate regulation section includes:
   a plurality of series circuits, each of which is formed of a switch and a capacitor and connected between the control terminal and a reference potential conductive terminal of the output switching element,
   each switch being turned on and off in synchronization with an input timing of the driving signal.

7. The switching element driving device according to claim 1, wherein the slew rate regulation section includes:
   a parallel circuit including a plurality of switching elements to be controlled as the output switching element; and
   a plurality of delay circuits provided in correspondence to the plurality of switching elements and outputting the driving signal to control terminals of corresponding ones of the switching elements,
   each of the delay circuit including a series circuit of an even number inverter gates, which are connected in series, and switches, which are connected to input terminals of the inverter gates at every odd number of inverter gates and an output terminal of a last one of the inverter gates, the switches being switched over to turn on and off in synchronization with an input timing of the driving signal.

8. The switching element driving device according to claim 1, wherein the slew rate regulation section includes:
   a parallel circuit including a plurality of parallel-connected switching elements to be controlled as the output switching element; and
   a plurality of switches, each switch having one end connected to an output terminal of the driving signal generation section and another end connected to a control terminal of one of the parallel-connected switching elements, respectively,
   the plurality of switches being turned on and off in synchronization with an input timing.

9. A driving method for a switching element comprising:
   generating a driving signal and outputting the driving signal to a control terminal of the switching element to be controlled; and
   variably regulating a slew rate of a voltage waveform of a voltage outputted to an electric load through the switching element,
   wherein variably regulating the slew rate of a voltage waveform includes varying periodically a time period of voltage waveform variation between $\Delta t - \alpha$ and $\Delta t + \alpha$ relative to a reference value $\Delta t$ for each of the driving signals so that an average value equals the reference value $\Delta t$.

10. The switching element driving device according to claim 1, wherein:
    the slew rate regulation section is connected between the driving signal generation section and the output switching element;
    the slew rate regulation section is configured to vary a time period of a rising voltage waveform and a time period of a falling voltage waveform of each driving signal at a same change rate; and
    the slew rate regulation section is configured to vary a time period of voltage waveform variation to increase and decrease alternately relative to the reference value $\Delta t$ in a series of driving signals.

11. The driving method for a switching element according to claim 9, wherein:
    variably regulating the slew rate of a voltage waveform includes variably regulating a time period of a rising voltage waveform and a time period of a falling voltage waveform of each driving signal at a same change rate, thereby regulating the slew rate of the voltage waveform outputted to the electric load; and
    variably regulating the slew rate of a voltage waveform further includes variably regulating a time period of voltage waveform variation to increase and decrease alternately relative to a reference value $\Delta t$ in a series of driving signals.

* * * * *